United States Patent
Ikemura et al.

(10) Patent No.: US 12,274,170 B2
(45) Date of Patent: Apr. 8, 2025

(54) THERMOELECTRIC POWER-GENERATION MODULE, WEARABLE BIOLOGICAL-BODY-SENSING DEVICE, BIOLOGICAL-BODY LOCATION DETECTION SYSTEM

(71) Applicants: E-ThermoGentek Co., Ltd., Kyoto (JP); NATIONAL UNIVERSITY CORPORATION KOBE UNIVERSITY, Kobe (JP)

(72) Inventors: Akihiko Ikemura, Kyoto (JP); Hiroshi Tanida, Kyoto (JP); Michio Okajima, Kyoto (JP); Keiichi Ohata, Kyoto (JP); Shutaro Nambu, Kyoto (JP); Shintaro Izumi, Kobe (JP)

(73) Assignees: E-ThermoGentek Co., Ltd., Kyoto (JP); NATIONAL UNIVERSITY CORPORATION KOBE UNIVERSITY, Hyogo (JP)

( * ) Notice: Subject to any disclaimer, the term of this patent is extended or adjusted under 35 U.S.C. 154(b) by 0 days.

(21) Appl. No.: 17/921,675

(22) PCT Filed: Nov. 5, 2020

(86) PCT No.: PCT/JP2020/041389
§ 371 (c)(1),
(2) Date: Oct. 27, 2022

(87) PCT Pub. No.: WO2021/220533
PCT Pub. Date: Nov. 4, 2021

(65) Prior Publication Data
US 2023/0180611 A1    Jun. 8, 2023

(30) Foreign Application Priority Data
May 1, 2020 (JP) ................................ 2020-081479

(51) Int. Cl.
*H10N 10/17* (2023.01)
*H10N 10/01* (2023.01)

(52) U.S. Cl.
CPC ............. *H10N 10/17* (2023.02); *H10N 10/01* (2023.02)

(58) Field of Classification Search
None
See application file for complete search history.

(56) References Cited

U.S. PATENT DOCUMENTS

| | | | | |
|---|---|---|---|---|
| 5,952,728 A | * | 9/1999 | Imanishi | H10N 19/101 257/713 |
| 2003/0057560 A1 | * | 3/2003 | Tatoh | H10N 10/17 257/773 |

(Continued)

FOREIGN PATENT DOCUMENTS

| | | |
|---|---|---|
| JP | 2003008087 A | 1/2003 |
| JP | 2003258323 A | 9/2003 |

(Continued)

OTHER PUBLICATIONS

English Language machine translation of WO-2019039221-A1. (Year: 2024).*

(Continued)

*Primary Examiner* — Eli S Mekhlin
(74) *Attorney, Agent, or Firm* — Renner, Otto, Boisselle & Sklar, LLP

(57) ABSTRACT

Provided is a thermoelectric generation module including a plurality of p-type thermoelectric elements 24a and a plurality of n-type thermoelectric elements 24b alternately connected in series and mounted with sandwiched by first and second flexible printed circuit boards 32, 33. The p-type thermoelectric elements and the n-type thermoelectric ele- (Continued)

ments have a chip size of 1 mm or less and 0.2 mm or greater and a height of 0.8 mm or greater and 3 mm or less.

6 Claims, 9 Drawing Sheets

(56) References Cited

U.S. PATENT DOCUMENTS

| | | | | |
|---|---|---|---|---|
| 2010/0186422 | A1* | 7/2010 | Yang | H10N 10/13 62/239 |
| 2010/0257871 | A1* | 10/2010 | Venkatasubramanian | H01L 23/38 62/3.7 |
| 2016/0228050 | A1* | 8/2016 | Sugla | A61B 5/447 |
| 2016/0321125 | A1* | 11/2016 | Kang | G06F 11/079 |
| 2016/0329476 | A1* | 11/2016 | Uchiyama | H10N 10/13 |
| 2017/0281083 | A1 | 10/2017 | Sawano | |
| 2018/0130938 | A1 | 5/2018 | Kohtani et al. | |

FOREIGN PATENT DOCUMENTS

| | | | |
|---|---|---|---|
| JP | 2004-079883 A | 3/2004 | |
| JP | 2005353710 A | 12/2005 | |
| JP | 2010135620 A | 6/2010 | |
| JP | 2011-091243 A | 5/2011 | |
| JP | 2011-198831 A | 10/2011 | |
| JP | 2016-207995 A | 12/2016 | |
| JP | 2017-510992 A | 4/2017 | |
| KR | 20190028948 A * | 3/2019 | H01L 35/12 |
| WO | 2015/148554 A1 | 10/2015 | |
| WO | 2016/068295 A1 | 5/2016 | |
| WO | WO-2019039221 A1 * | 2/2019 | H01L 23/38 |

OTHER PUBLICATIONS

English language machine translation of KR-20190028948-A. (Year: 2024).*
Ray et al., Chem Rev., 2019, 119, 5461-5533. (Year: 2019).*
International Search Report for corresponding Application No. PCT/JP2020/041389, mailed Feb. 9, 2021.
Materia, vol. 38, No. 3 (1999), pp. 257 to 259, with partial translation; discussed in specification.

* cited by examiner

THERMOELECTRIC POWER-GENERATION MODULE, WEARABLE BIOLOGICAL-BODY-SENSING DEVICE, BIOLOGICAL-BODY LOCATION DETECTION SYSTEM

TECHNICAL FIELD

The present invention relates to a thermoelectric generation module that closely contacts a biological body to generate power from biological body heat and is driven by such power and a wearable biosensing device and a biological body location detection system using the thermoelectric generation module.

BACKGROUND ART

Due to importance of preventive care, a wearable device constantly closely contacting a biological body to fulfill, e.g., a function of sensing, managing, and communicating medical data on the biological body and being capable of notifying location information on the biological body has been actively studied and developed. Since the wearable device constantly closely contacts the biological body, a thorough reduction in the size and power consumption of the device is essential. At the same time, a power supply driving the device needs to be wearable.

Typically, a small battery has mainly been employed as the power supply driving the wearable device. However, there is a significant problem in a battery replacement cost, and a demand for development of a stand-alone power supply using thermoelectric generation by means of heat from the biological body has been increased.

As such a wearable thermoelectric generation device, Non-Patent Document 1 discloses a watch-like wearable device operable by slight thermoelectric generation by a biological body. This watch-like wearable device is driven by power generated from 10 thermoelectric generation units connected in series, each thermoelectric generation unit being configured such that minute thermoelectric elements having a length of 80 μm, a width of 80 μm, and a height of 600 μm are, by an advanced mounting technique, densely mounted on two Si boards having a length of 2 mm, a width of 2 mm, and a thickness of 300 μm.

However, this wearable device involves a high cost because the thermoelectric elements are densely mounted by the advanced mounting technique, and in addition, the generated power per unit area is a low power of 3 mV/cm$^2$ and 1 μW/cm$^2$. For this reason, this wearable device cannot be used for a more-advanced biosensing device having a communication function etc.

The applicant of the present application has disclosed, in Patent Document 1, a high-efficiency flexible thermoelectric generation module capable of efficiently generating power from a low-temperature exhaust heat source. FIG. 11 is a sectional view showing the configuration of the flexible thermoelectric generation module disclosed in Patent Document 1. As shown in FIG. 11, the thermoelectric generation module has such a structure that a plurality of thermoelectric elements 102 is densely mounted on a flexible printed circuit board 101 and is wire-connected through a flexible printed circuit board 103 arranged on the thermoelectric elements 102. Moreover, slits 104 are formed at the flexible printed circuit board 103, and accordingly, the thermoelectric generation module is freely bendable. As a result, the thermoelectric generation module can be, with favorable contact, attached to the heat source having a curved surface.

This thermoelectric generation module can generate power in close contact with a biological body, and therefore, has a higher power generation efficiency than that of the typical wearable device stand-alone power supply using thermoelectric generation. However, for the advanced wearable biosensing device having the communication function etc., a slight temperature difference and power generation with a small area are necessary. This thermoelectric generation module still has a problem that a generated voltage or power per unit area is too low and the thermoelectric generation module cannot be used as it is.

CITATION LIST

Patent Document

PATENT DOCUMENT 1: Japanese Unexamined Patent Publication No. 2016-207995

Non-Patent Document

NON-PATENT DOCUMENT 1: MATERIA, Vol. 38, No. 3 (1999), Pages 257 to 259

SUMMARY OF THE INVENTION

Technical Problem

In thermoelectric generation, a power generation amount can increase as a temperature difference between both ends of the thermoelectric generation module increases. However, in a case where the thermoelectric generation module constantly closely contacts the biological body to generate power, even when the thermoelectric generation module includes thermoelectric elements in a shape with a high aspect ratio in order to increase the thermal resistance of the thermoelectric generation module, e.g., if the temperature of the biological body as the heat source is 35° C. and an ambient air temperature is 30° C., only a temperature difference of exceeding 1° C. at most can be ensured between both ends of the thermoelectric generation module.

For driving an advanced wearable biosensing device having, e.g., a function of sensing, managing, and communicating medical data on the biological body, this thermoelectric generation module having a slight temperature difference of about 1° C. and a small area of about 5 cm×2.5 cm essential for the wearable device needs to generate an operating voltage of at least about 100 mV (8 mV/cm$^2$) and a power of at least about 100 μW (8 μW/cm$^2$).

In order for the thermoelectric generation module having a small temperature difference of about 1° C. and the small area to generate the power necessary for driving the wearable device, the thermoelectric element needs to be reduced in size and be elongated to increase the aspect ratio, and many thermoelectric elements needs to be connected in series and be densely mounted within the small area.

According to experiment, even in the case of a thermoelectric element made of a BiTe-based thermoelectric material having an excellent thermoelectric conversion efficiency, at least 1000 thermoelectric elements having a width of 1 mm, a length of 1 mm, and a height of 1.5 mm, i.e., 500 pairs of p-type and n-type thermoelectric elements (pn pairs), need to be connected in series in order to obtain a power of 100 mV and 100 μW with a temperature difference of 1° C., for example. In the wearable device, the size of the thermoelectric generation module needs to be at least 2.5 cm×5.0 cm or less, and for this reason, the thermoelectric elements need to be mounted with a high density of 80 (40 pn pairs)/cm² or greater.

However, the thermoelectric element is generally brittle and easily broken, and for this reason, handling upon mounting of the thermoelectric elements becomes more difficult as the chip size of the thermoelectric element decreases. Thus, a thermoelectric generation module has never been provided, in which many thermoelectric elements necessary for generating practical electromotive force with a slight temperature difference of about 1° C. are mounted on a flexible printed circuit board with, e.g., a high density of 50 (25 pn pairs)/cm² or greater.

In thermoelectric generation, the power generation amount can increase as the temperature difference between both ends of the thermoelectric generation module increases. Thus, in the thermoelectric generation module, e.g., an air-cooling radiation fin or a water-cooling cooler normally closely contacts a low-temperature side to increase the temperature difference between both ends of the module as much as possible in order to decrease a thermal resistance between the module and the ambient air. However, in a wearable thermoelectric generation module that generates power with a difference between a body temperature and an ambient air temperature, a large cooler cannot be installed on the outside, and for this reason, it is difficult to increase the temperature difference.

The present invention has been made in view of the above-described problems, and a main object of the present invention is to provide a thermoelectric generation module configured so that ultracompact thermoelectric elements having a high aspect ratio can be densely mounted on a flexible printed circuit board and being capable of driving an advanced wearable biosensing device even with an extremely-small size and a small temperature difference.

Another object is to provide a thermoelectric generation module configured so that a temperature difference between both ends of the thermoelectric generation module can be 1° C. or greater even in a case where the thermoelectric generation module closely contacts a biological body to generate power.

Solution to the Problem

The thermoelectric generation module according to the present invention is a thermoelectric generation module including a plurality of p-type thermoelectric elements and a plurality of n-type thermoelectric elements alternately connected in series and mounted with sandwiched by first and second flexible printed circuit boards. The p-type thermoelectric elements and the n-type thermoelectric elements have a chip size of 1 mm or less and 0.2 mm or greater and a height of 0.8 mm or greater and 3 mm or less.

In one preferred embodiment, the p-type thermoelectric elements and the n-type thermoelectric elements are cylinders having an aspect ratio (Cylinder Height/Base Circle Diameter) of 1.5 or greater, and the mounting density of the p-type thermoelectric elements and the n-type thermoelectric elements is 80 or greater per cm².

Advantages of the Invention

According to the present invention, the thermoelectric generation module can be provided, which is configured so that the ultracompact thermoelectric elements having the high aspect ratio can be densely mounted and is capable of driving the advanced wearable biosensing device even with the extremely-small size and the small temperature difference.

Moreover, the thermoelectric generation module can be provided, which is configured so that the temperature difference between both ends of the thermoelectric generation module can be 1° C. or greater even in a case where the thermoelectric generation module closely contacts the biological body to generate power.

DESCRIPTION OF EMBODIMENTS

Hereinafter, an embodiment of the present invention will be described in detail based on the drawings. Note that the present invention is not limited to the embodiment below. Moreover, changes can be made as necessary without departing from a scope in which the advantageous effects of the present invention are produced.

Figure 1:
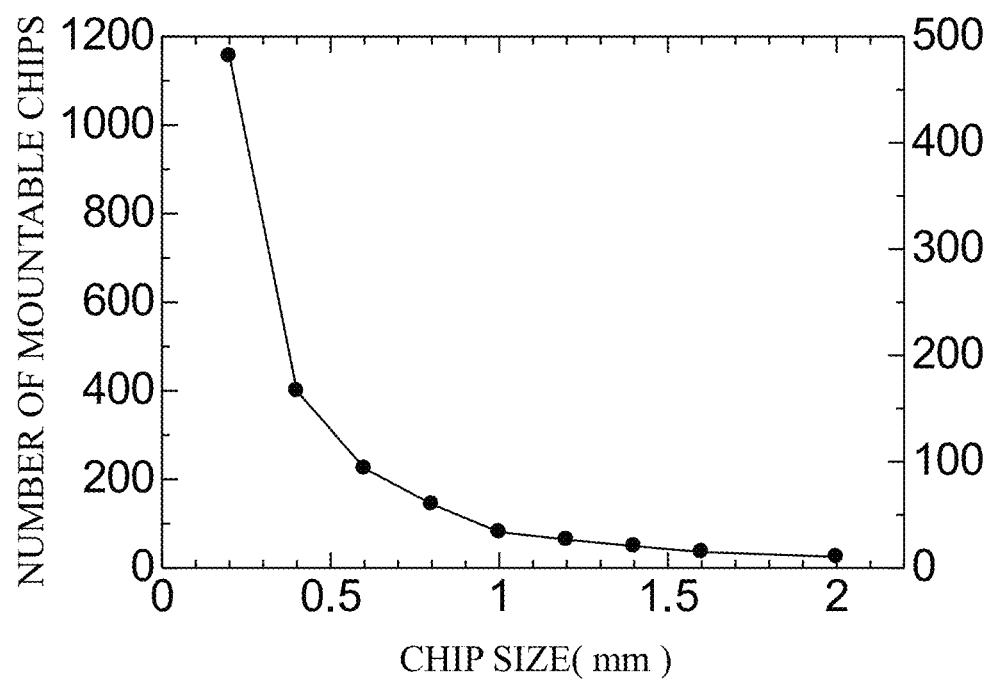
FIG. 1 is a graph showing the number of thermoelectric elements mountable per cm² in association with the chip size of the thermoelectric element.

FIG. 1 is a graph showing the number of thermoelectric elements mountable per cm², the number being calculated in association with a chip size of the thermoelectric element. The chip size described herein is the diameter of the thermoelectric element in a case where the thermoelectric element is a cylinder, and is the length (an average length in a case where two sides have different lengths) of one side of the thermoelectric element in a case where the thermoelectric element is a quadrangular prism. For mounting the thermoelectric elements as dense as possible, an inter-chip distance is an extremely-narrow distance of 0.1 mm.

As shown in FIG. 1, about 80 thermoelectric elements are mountable per cm² in the case of a chip size of 1 mm, and the number of mountable thermoelectric elements significantly increases in the case of a chip size of 1 mm or less. Thus, the chip size is set to 1 mm or less so that many thermoelectric elements necessary for driving a wearable device can be densely mounted. If the chip size is too small, chip robustness is degraded, and for this reason, the chip size is preferably 0.2 mm or greater.

Next, the method for manufacturing a thermoelectric generation module in the present embodiment will be described with reference to FIGS. 2 to 5.

Figure 2:
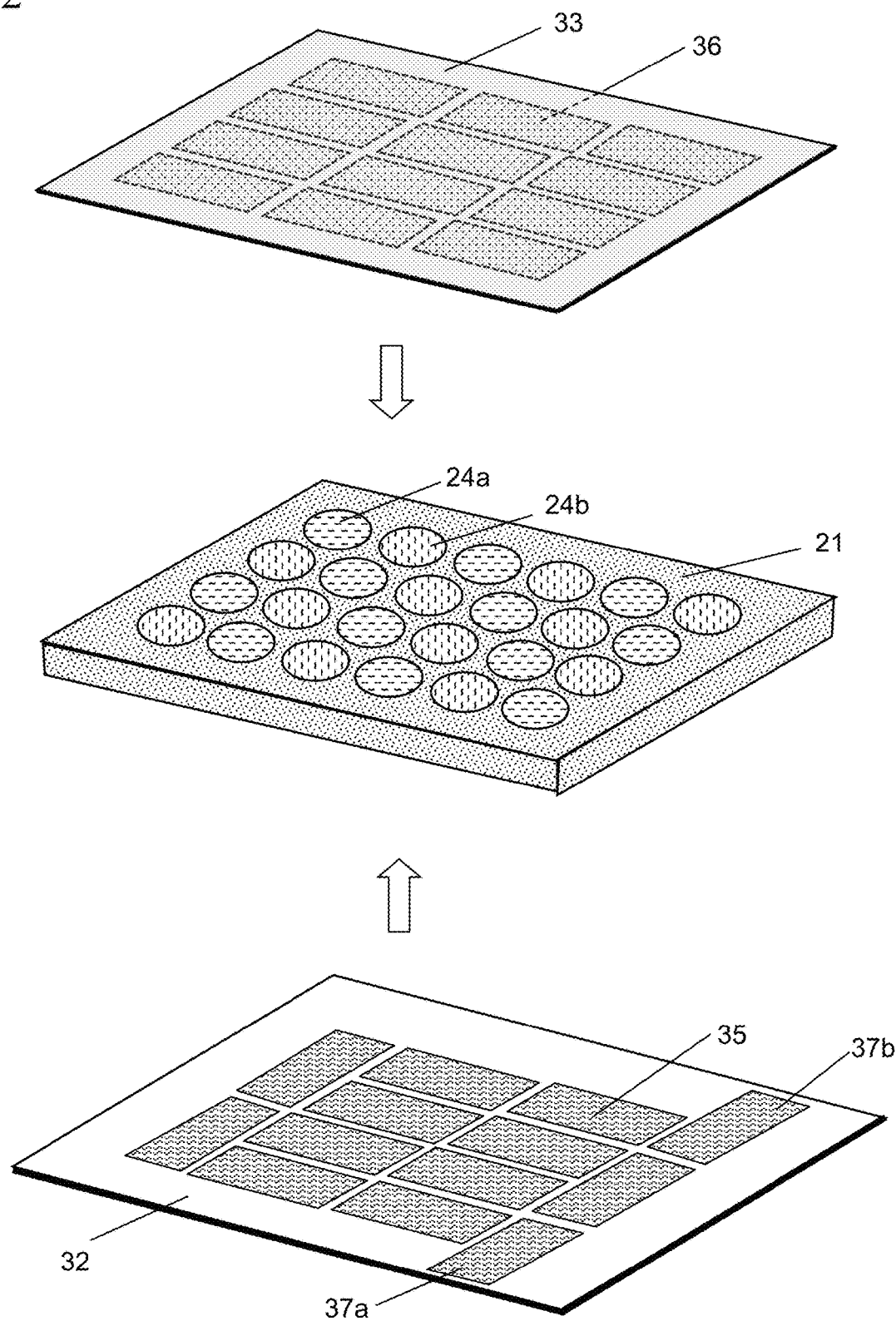
FIG. 2 is a view for describing the method for manufacturing a thermoelectric generation module in the present embodiment.

As shown in FIG. 2, a thin resin film 21 is prepared such that cylindrical p-type thermoelectric elements 24a and cylindrical n-type thermoelectric elements 24b are, for example, embedded in the thin resin film 21 with a high density of 9×9=81/cm². The p-type thermoelectric element 24a includes a BiSbTe chip, and the n-type thermoelectric element 24b includes a BiTe chip, for example. Electrodes are formed at both ends of the thermoelectric element 24a, 24b.

Meanwhile, two first and second flexible printed circuit boards 32, 33 on which the thermoelectric elements are to be mounted are prepared. The flexible printed circuit boards 32, 33 are preferably made of a base material containing polyimide, and preferably have a thickness of 5 μm to 40 μm, for example. Wiring layers 35, 36 formed on the first and second flexible printed circuit boards 32, 33 are preferably formed of Cu layers, and preferably have a thickness of 8 μm to 35 μm, for example. Extraction electrodes 37a, 37b at ends of the wiring layers 35 are formed on the first flexible printed circuit board 32.

Figure 3:
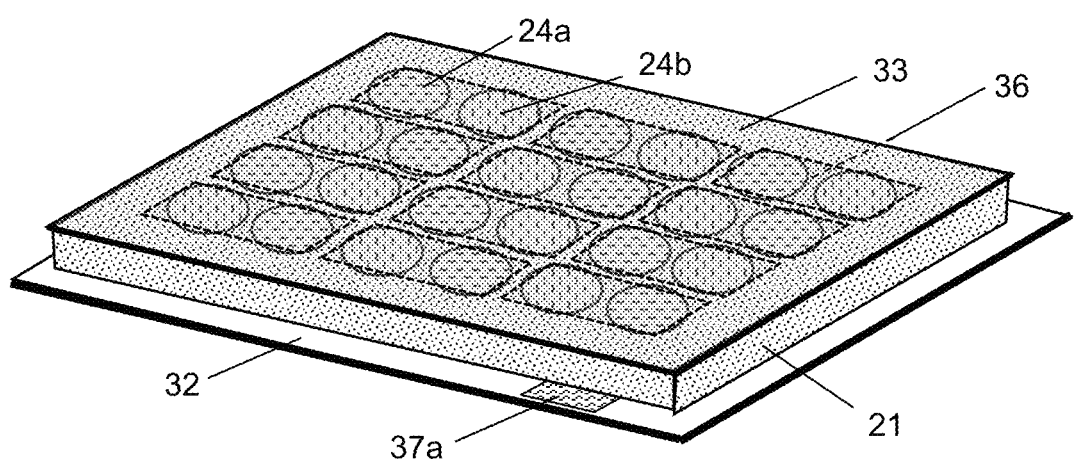
FIG. 3 is a view for describing the method for manufacturing the thermoelectric generation module in the present embodiment.

Next, as shown in FIG. 3, the thermoelectric elements 24a, 24b embedded in the thin resin film 21 are joined to the wiring layers 35 of the first flexible printed circuit board 32 and the wiring layers 36 of the second flexible printed circuit board 33 by, e.g., a lead-free solder paste (Sn—Ag—Cu) reflow process.

Figure 4:
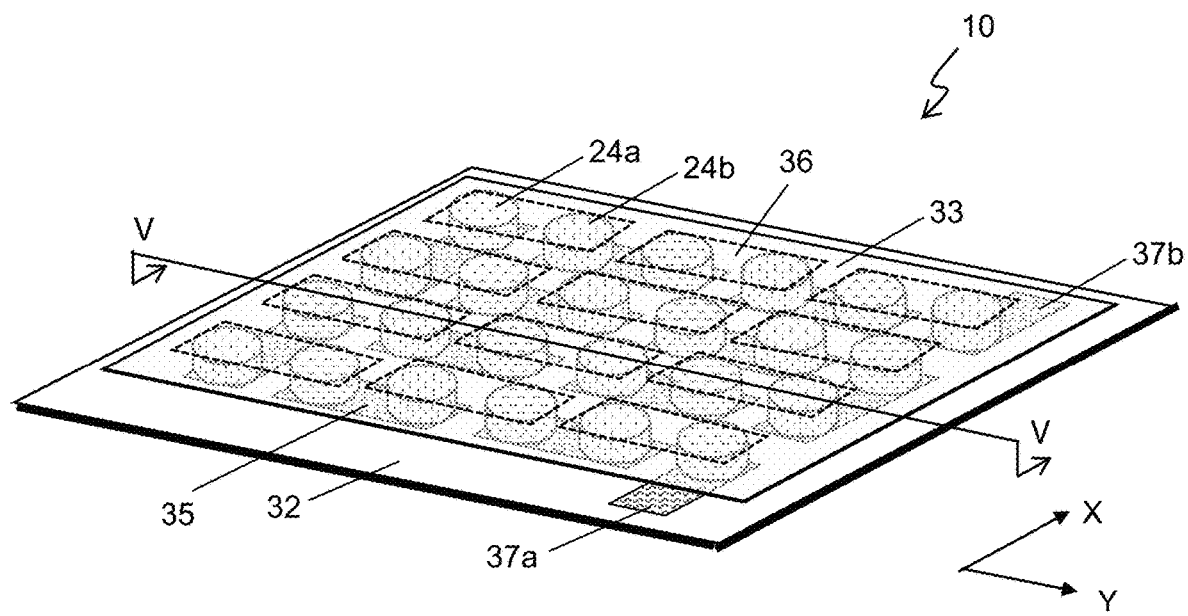
FIG. 4 is a view for describing the method for manufacturing the thermoelectric generation module in the present embodiment.
Figure 5:
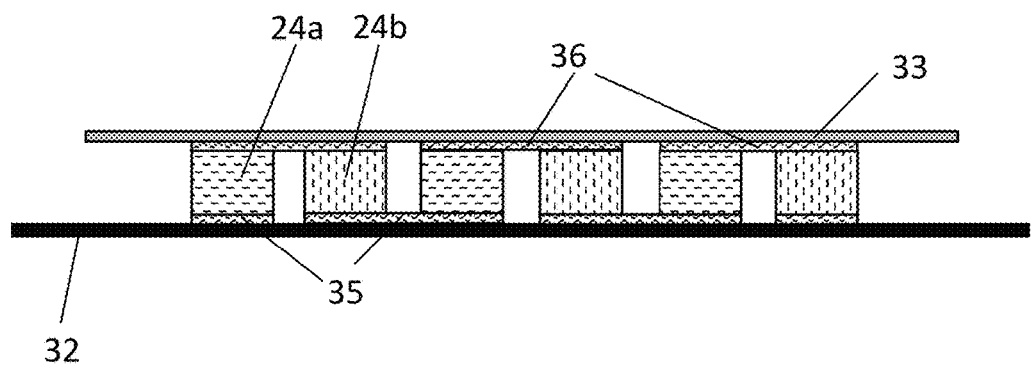
FIG. 5 is a sectional view of the thermoelectric generation module along a V-V line of FIG. 4.

Next, as shown in FIG. 4, the thin resin film 21 is dissolved and removed, and a thermoelectric generation module 10 is completed. FIG. 5 shows a sectional view of the thermoelectric generation module 10 along a V-V line of FIG. 4. Note that for the sake of simplicity in illustration of the structure, FIG. 4 shows the wiring layers 36 on a lower surface of the second flexible printed circuit board 33, the thermoelectric element chips 24a, 24b, and the wiring layers 35 on the first flexible printed circuit board 32 through the second flexible printed circuit board 33.

The thin resin film 21 is dissolved and removed in order to decrease thermal conduction between the thermoelectric element 24a, 24b chips due to resin and increase a temperature difference between both ends of the thermoelectric generation module.

The thin resin film 21 may be left, and in this case, resin having a low thermal conductivity is preferably used. For example, foamable resin such as foamed polyurethane, foamed polystyrene, or melamine foam is preferably used. Alternatively, silicone resin having a low thermal conductivity may be used.

Figure 6:
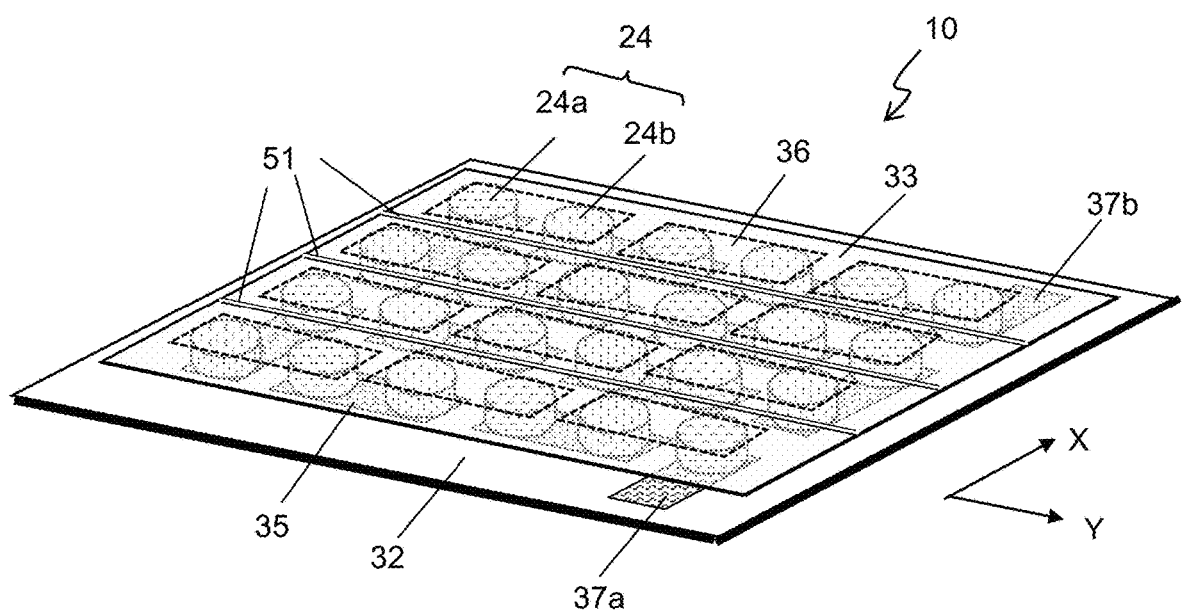
FIG. 6 is a view showing the configuration of the thermoelectric generation module in the present embodiment.

As shown in FIG. 6, slits 51 may be formed at the second flexible printed circuit board 33 such that the thermoelectric generation module 10 is freely bendable.

Next, a technique of increasing, for obtaining a great power generation amount, the temperature difference between both ends of the thermoelectric generation module in a state in which a biological body wears the thermoelectric generation module 10 will be described.

A thermal resistance from the biological body to ambient air is the sum of a thermal contact resistance between the biological body and the thermoelectric generation module 10, the thermal resistance of the thermoelectric generation module 10, and a thermal resistance relating to heat release from the thermoelectric generation module 10 to the ambient air. In the case of wearing the thermoelectric generation module 10, a cooler such as a radiation fin cannot attached to the outside of the thermoelectric generation module 10, and for this reason, the resistance of heat released from the thermoelectric generation module 10 to the ambient air is significantly high and the temperature difference between both ends of the thermoelectric generation module cannot be increased in this state.

Figure 7:
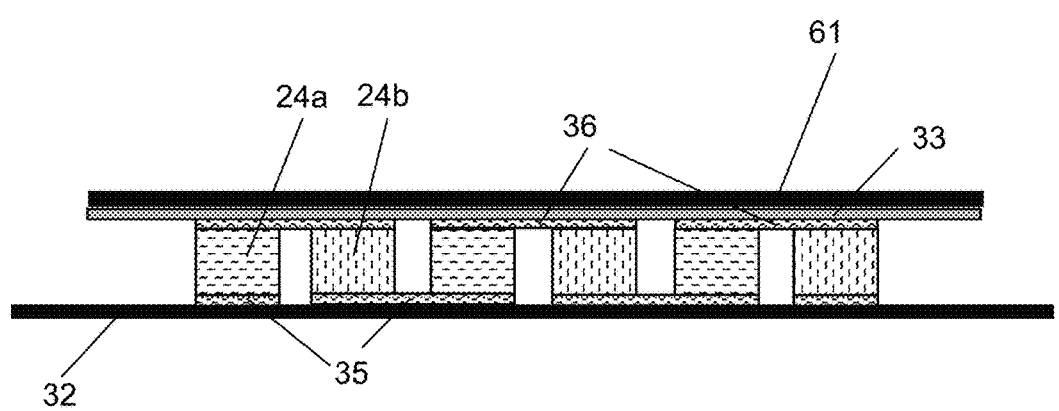
FIG. 7 is a view showing the configuration of a thermoelectric generation module in another embodiment.

For these reasons, in the present embodiment, a highly-heat-radiative flexible sheet 61 exhibiting favorable thermal radiation is attached to the outside of the thermoelectric generation module 10, as shown in FIG. 7. As a result, the thermal resistance when heat is released from the thermoelectric generation module 10 to the ambient air can be decreased, and the temperature difference between both ends of the thermoelectric generation module can be increased.

For increasing the temperature difference between both ends of the thermoelectric generation module, it is important to increase the thermal resistance of the thermoelectric generation module 10 in addition to a decrease in the thermal resistance from the thermoelectric generation module 10 to the ambient air by the highly-heat-radiative flexible sheet 61 as described above. The thermal resistance of the thermoelectric generation module 10 is substantially proportional to the height of the thermoelectric element, and therefore, the height of the thermoelectric element needs to be increased to increase an aspect ratio. In the case of wearing the thermoelectric generation module 10, if the thermoelectric element is, for example, in the cylindrical shape, the aspect ratio (=Height/Base Circle Diameter) needs to be at least 1.5 or greater.

According to experiment, in a case where the highly-heat-radiative flexible sheet 61 is attached to the outside of the thermoelectric generation module 10, if the height of the cylindrical chip having a diameter of 1.0 mm is 2 mm or greater, the temperature difference between both ends of the thermoelectric generation module can be 30% or greater of a temperature difference between the biological body and the ambient air.

Note that the thermal resistance increases and a greater temperature difference is obtained as the chip height increases, but if the chip height is too great, the electric resistance of the thermoelectric element increases and the output thereof declines. For these reasons, the chip height is preferably 3 mm or less. The practical chip height of the thermoelectric element is preferably 0.8 mm or greater and 3 mm or less.

Next, a technique of providing a wearable biosensing device having, e.g., a function of sensing, managing, and communicating medical data on the biological body, being capable of notifying location information on the biological body, and using thermoelectric generation will be described.

Figure 8:
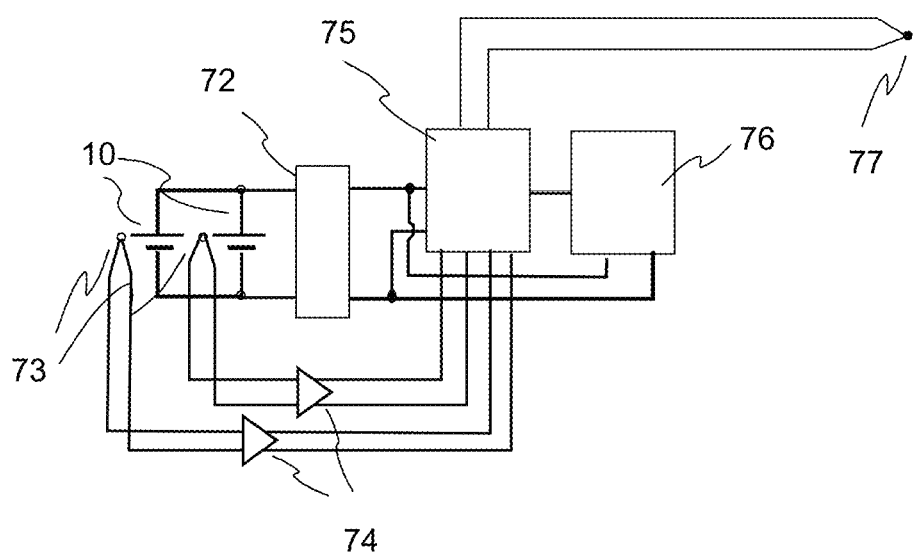
FIG. 8 is a block diagram showing the configuration of a wearable biosensing device.

FIG. 8 is a block diagram showing an example where the wearable biosensing device using thermoelectric generation is applied to the case of body temperature measurement.

As shown in FIG. 8, an output power generated by the thermoelectric generation module 10 is, by a DC-DC converter circuit 72, converted into a power-supply voltage necessary for driving each of a biosensor 73 such as a body temperature sensor (or a heat flowmeter or a heart rate meter), signal processing semiconductor circuits 74, 75 amplifying and processing a signal from the biosensor 73, and a wireless communication semiconductor circuit 76 transmitting signal-processed data and an individual identification number. At this point, an environmental temperature measurement sensor 77 is also attached as necessary.

Figure 9A:
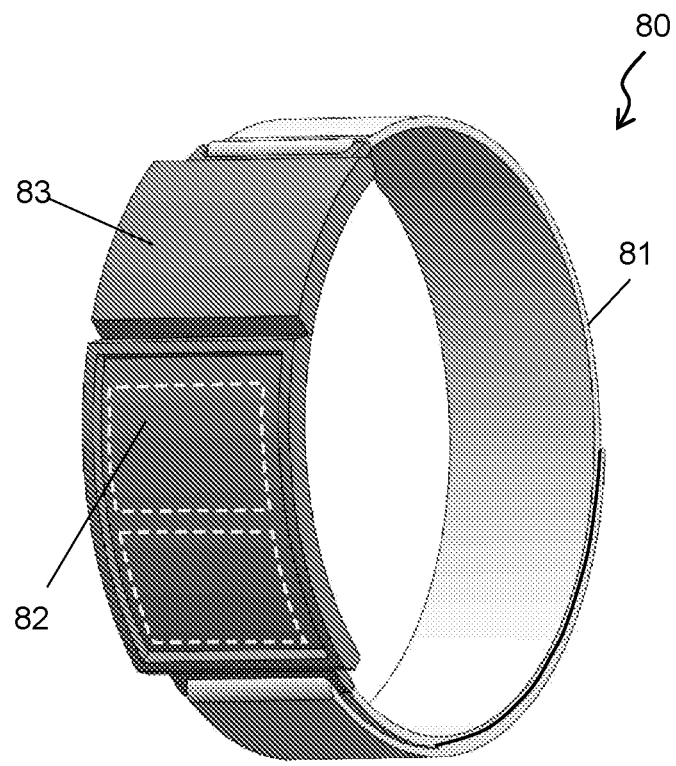
FIGS. 9A and 9B are views showing the configuration of the wearable biosensing device.
Figure 9B:
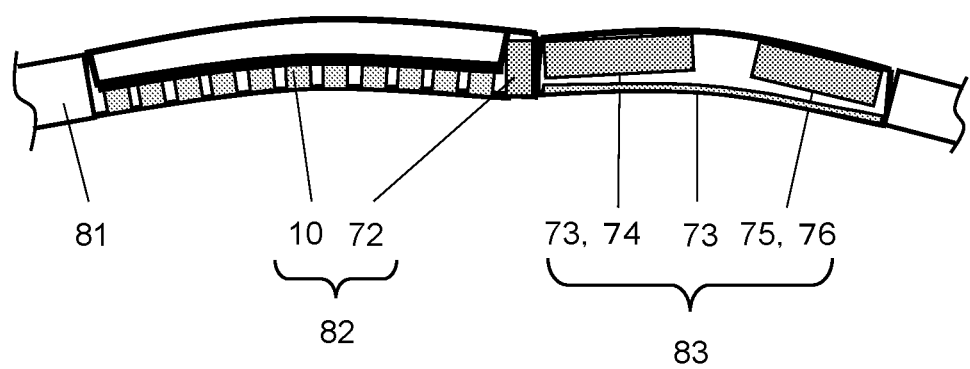

A wearable biosensing device 80 is configured such that components such as the thermoelectric generation module 10 and the semiconductor circuit chips are mounted on a flexible band 81 attachable in close contact with, e.g., an arm, as shown in FIGS. 9A and 9B.

The wearable biosensing device 80 shown as an example in FIGS. 9A and 9B includes a stand-alone power supply unit 82 having the thermoelectric generation module 10 and the DC-DC converter circuit 72 and a biosensor unit 83 having the biosensor 73, the signal amplifying circuit 74, the signal processing semiconductor circuit 75, and the wireless communication semiconductor circuit 76.

According to the present embodiment, the wearable biosensing device can be provided, which constantly closely contacts the biological body to obtain the required power to fulfill, e.g., the function of sensing, managing, and communicating the medical data on the biological body and is capable of notifying the location information on the biological body. As a result, it is expected that new various preventive medical systems for heatstroke prevention etc. can be built in the future.

Figure 10:
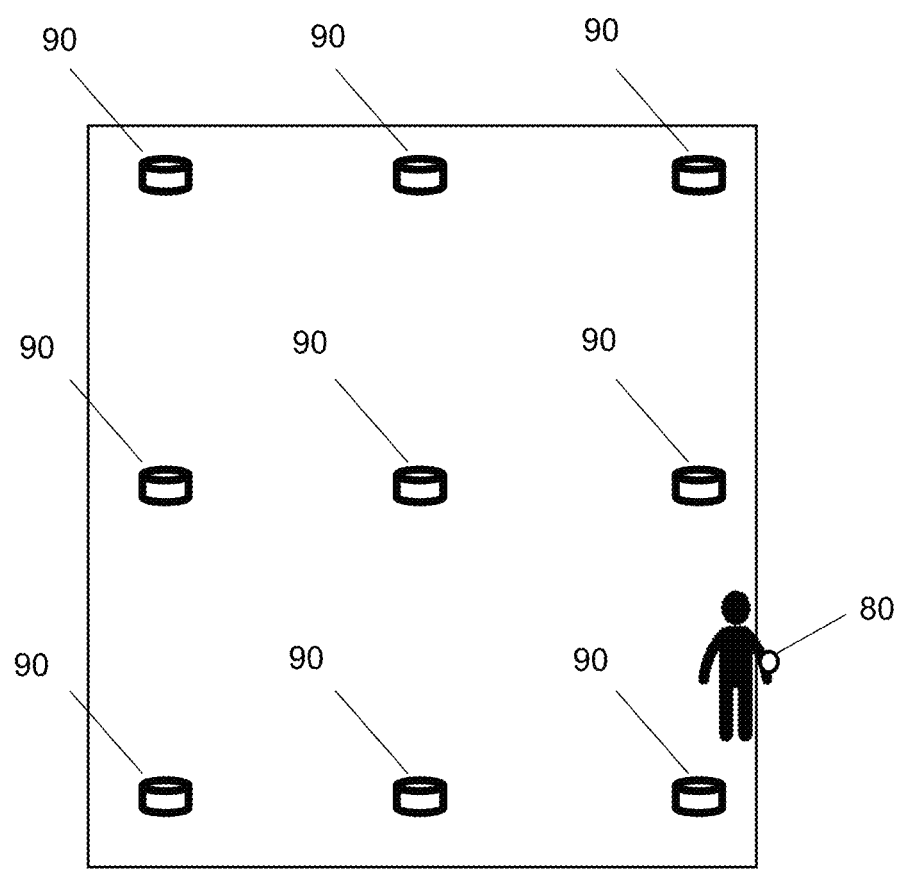
FIG. 10 is a view showing the configuration of a biological body location detection system.
Figure 11:
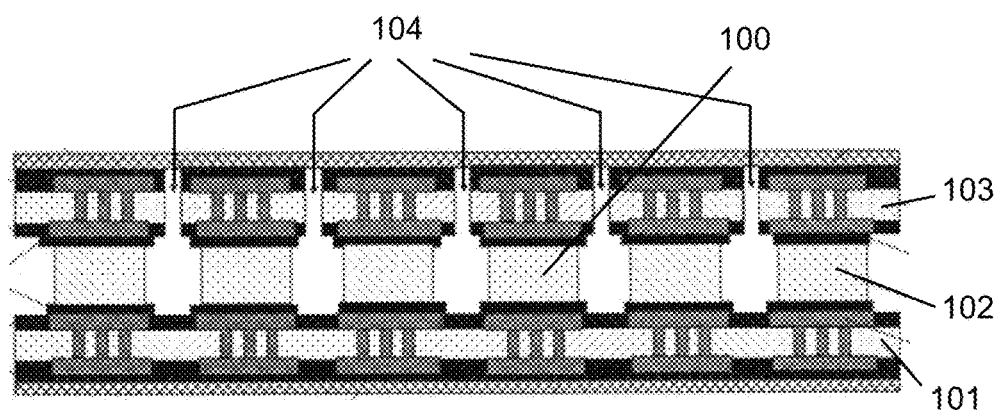
FIG. 11 is a sectional view showing the configuration of a typical thermoelectric generation module.

As shown in FIG. 10, the wearable biosensing device 80 is used as a wearable beacon regularly and intermittently transmitting the individual identification number and surrounded by many receivers 90 installed in an area of several meters to several tens of meters in an indoor space or a compartment so that a biological body location detection system capable of detecting the location of the biological body by means of the individual identification number received from many receivers 90 can be provided.

In the case of installing many receivers 90, there is a power consumption program, but power for these receivers is ensured by the thermoelectric generation module 10 so that a battery-less biological body location detection system can also be provided.

Referring to FIG. 4 again, the configuration of the thermoelectric generation module 10 in the present embodiment will be described in detail.

As shown in FIG. 4, the thermoelectric generation module 10 is configured such that the plurality of cylindrical thermoelectric elements 24 made of BiTe-based single crystals are mounted with sandwiched between the first and second flexible printed circuit boards 32, 33. On the first and second flexible printed circuit boards 32, 33, the wiring layers 35, 36 each connected to the thermoelectric elements 24 are formed. The BiTe-based single crystal as the thermoelectric material is often formed in the cylindrical shape, but may be formed in other shapes.

Note that for the sake of simplicity in illustration of the structure, FIG. 4 shows the wiring layers 36 on the lower surface of the second flexible printed circuit board 33, the thermoelectric element chips 24a, 24b, and the wiring layers 35 on the first flexible printed circuit board 32 through the second flexible printed circuit board 33.

The thermoelectric elements 24 include the p-type thermoelectric elements 24a and the n-type thermoelectric elements 24b, and are alternately connected in series in the direction of an arrow Y through the wiring layers 35, 36 formed on the first and second flexible printed circuit boards 32, 33. A plurality of lines of the thermoelectric elements 24 connected in series are arrayed in an X-direction perpendicular to the Y-direction.

As shown in FIG. 6, the slit 51 may be, at the second flexible printed circuit board 33, formed in the Y-direction between adjacent ones of the lines of the thermoelectric elements 24 connected in series. With this configuration, the thermoelectric generation module 10 is easily bendable in the X-direction. When the thermoelectric generation module 10 is bent along the arm, the second flexible printed circuit board 33 on the outside needs to be more stretched as compared to the first flexible printed circuit board 32 on the inside because the thermoelectric generation module 10 is thick. With the slits 51, such stretch can be ensured. The first flexible printed circuit board 32 is formed with the extraction electrodes 37a, 37b at the ends of the wiring layers 35.

Since the thermoelectric generation module 10 is easily bendable in the direction X about the arm and is attachable in close contact with the arm, power for practical use can be obtained even with a slight difference between the body temperature and the ambient air temperature.

Note that instead of forming the slits 51 at the second flexible printed circuit board 33, easily-stretchable base materials may be used for the first and second flexible printed circuit boards 32, 33. With this configuration, the thermoelectric generation module 10 is substantially freely bendable. In a case where the thermoelectric generation module 10 needs to be easily stretchable in one direction, such as the case of attaching the thermoelectric generation module 10 to the arm, the easily-stretchable base material may be used only for either one of the first and second flexible printed circuit boards 32, 33. Examples of the stretchable base material to be used may include thermosetting elastomer and a silicone resin film. Other examples may include a polyamide film, a polycarbonate film, a polyolefin film, rubber, and a film in which carbon nanotubes are dispersed in rubber in order to increase the thermal conductivity. Note that a base material having a high thermal conductivity is preferably used. With this configuration, a thermal loss from the base material can be decreased, and the temperature difference at the thermoelectric element 24 can be increased as much as possible.

EXAMPLE

A cylindrical thermoelectric element made of a BiTe-based single crystal and having a diameter of 0.7 mm and a height of 2 mm was used as each of the thermoelectric elements 24a, 24b. In a case where these thermoelectric elements are arranged such that a distance between the center axes of the thermoelectric elements is 1 mm, 9×9=81 thermoelectric elements can be mounted per $cm^2$. Regarding a thermoelectric generation module mounting area, two thermoelectric generation modules having a size of 2.5 cm×2.5 cm were used so that these thermoelectric generation modules can be mounted on a wearable device. In this case, the number of mounted thermoelectric element chips was 24×24=576 per thermoelectric generation module.

As a result of experiment, it has been confirmed that a structure in which a graphite-blended fiber sheet having a high thermal conductivity of about 40 W/mK, exhibiting excellent black-body emissivity, having a large effective surface area due to an uneven sheet surface, and exhibiting excellent heat radiation and a graphite sheet having an extremely-high thermal conductivity of 1500 W/mK in a planar direction and having a small thickness are stacked on each other is particularly suitable as the highly-heat-radiative flexible sheet 61. As the highly-heat-radiative flexible sheet 61, a structure in which a graphite sheet having 25 μm is bonded to a graphite-blended fiber sheet having a thickness of 0.2 mm was used.

With this thermoelectric generation module, 60 mV and 75 μW were obtained with a temperature difference of 1° C. As a result, 120 mV and 150 μW were obtained using two thermoelectric generation modules, and in combination with a boost converter, a stand-alone power supply using thermoelectric generation and being capable of driving the wearable biosensing device could be provided.

DESCRIPTION OF REFERENCE CHARACTERS

10 Thermoelectric Generation Module
21 Thin Resin Film
24 Thermoelectric Element
24a p-Type Thermoelectric Element
24b n-Type Thermoelectric Element
32 First Flexible Printed Circuit Board
33 Second Flexible Printed Circuit Board
35, 36 Wiring Layer
37a, 37b Extraction Electrode
51 Slit
61 Highly-Heat-Radiative Flexible Sheet
72 DC-DC Converter Circuit
73 Biosensor
74 Signal Amplifying Circuit
75 Signal Processing Semiconductor Circuit
76 Wireless Communication Semiconductor Circuit
77 Environmental Temperature Measurement Sensor
80 Wearable Biosensing Device
81 Band
82 Stand-Alone Power Supply Unit
83 Biosensor Unit
90 Receiver

The invention claimed is:

1. A thermoelectric generation module configured to drive a wearable device, the wearable device configured to be worn by a biological body, the thermoelectric generation module comprising:
a plurality of p-type thermoelectric elements and a plurality of n-type thermoelectric elements alternately connected in series and mounted between and sandwiched by first and second flexible printed circuit boards, wherein:
the thermoelectric generation module is configured to drive the wearable device by using electric power that is obtained based on a temperature difference between the biological body and an ambient air when the wearable device is worn by the biological body,
the p-type thermoelectric elements and the n-type thermoelectric elements are cylinders having a chip size of 1 mm or less and 0.2 mm or greater in diameter, a height of 0.8 mm or greater and 3 mm or less, and an aspect ratio (Cylinder Height/Base Circle Diameter) of 1.5 or greater,
a mounting density of the p-type thermoelectric elements and the n-type thermoelectric elements is 80 or greater per $cm^2$, wherein
the p-type thermoelectric elements and the n-type thermoelectric elements are embedded in a thin resin film,
on both surfaces of the thin resin film, the first and second flexible printed circuit boards formed with wiring layers connecting the p-type thermoelectric elements and the n-type thermoelectric elements are provided, and
the thin resin film is made of melamine foam.

2. The thermoelectric generation module of claim 1, wherein
a highly-heat-radiative flexible sheet is provided on an outside of at least one of the first and second flexible printed circuit boards, and the highly-heat-radiative flexible sheet includes a graphite-blended fiber sheet or a stack of a graphite-blended fiber sheet and a graphite sheet having a high thermal conductivity.

3. A biological body location detection system comprising:
a wearable beacon that regularly and intermittently transmits an individual identification number; and
a plurality of stationary receivers that receives the individual identification number transmitted from the wearable beacon,
wherein the wearable beacon is a wearable biosensing device,
the wearable biosensing device including:
the thermoelectric generation module of claim 1;
a DC-DC converter circuit;
a biosensor;
a processing semiconductor circuit that processes a signal from the biosensor; and
a wireless communication semiconductor circuit that transmits data processed by the processing semiconductor circuit and an individual identification number,
the thermoelectric generation module, the DC-DC converter circuit, the biosensor, the processing semiconductor circuit, and the wireless communication semiconductor circuit are mounted on a flexible band,
the biosensor, the processing semiconductor circuit, and the wireless communication semiconductor circuit are driven by output power generated by the thermoelectric generation module and
a location of a biological body is detected from the individual identification number received by the plurality of stationary receivers.

4. A method of manufacturing a thermoelectric generation module configured to drive a wearable device, the wearable device configured to be worn by a biological body, the method comprising:
preparing a resin film made of melamine foam in which a plurality of p-type thermoelectric elements and a plurality of n-type thermoelectric elements alternately connected in series are embedded;
sandwiching the resin film between a first flexible printed circuit board and a second flexible printed circuit board; and
jointing alternately the plurality of p-type thermoelectric elements and the plurality of n-type thermoelectric elements embedded in the resin film to respective wiring layers formed on the first and second flexible printed circuit boards, wherein:
the thermoelectric generation module is configured to drive the wearable device using electric power that is obtained based on a temperature difference between the biological body and an ambient air when the wearable device is worn by the biological body;
the plurality of p-type thermoelectric elements and the plurality of n-type thermoelectric elements have a chip size of 1 mm or less and 0.2 mm or greater and a height of 0.8 mm or greater and 3 mm or less and are formed into cylinders having an aspect ratio (Cylinder Height/Base Circle Diameter) of 1.5 or greater; and
a mounting density of the p-type thermoelectric elements and the n-type thermoelectric elements is 80 or greater per $cm^2$.

5. The method of claim 4, further comprising:
removing the resin film after jointing alternately the plurality of p-type thermoelectric elements and the plurality of n-type thermoelectric elements embedded in the resin film to respective wiring layers formed on the first and second flexible printed circuit boards.

6. A thermoelectric generation module configured to be incorporated within a wearable biosensor device configured to be worn by a biological body, the thermoelectric generation module comprising:
an array comprising a first flexible printed circuit board and a second flexible printed circuit board positioned opposite to the first flexible printed circuit board;
a thin resin film having a relatively low thermal conductivity, wherein the thin resin film includes melamine foam and is positioned between the first flexible printed circuit board and the second flexible printed circuit board; and
a plurality of thermoelectric elements alternately connected in series, mounted between first and second flexible printed circuit boards, and embedded in the thin resin film, wherein:
the thermoelectric generation module is configured to drive the wearable device by using electric power that is obtained based on a temperature difference between the biological body through the thin resin film and an ambient air surrounding the biological body, and
the relatively low thermal conductivity of the thin resin film increases a temperature difference between opposing ends of the thermoelectric generation module and correspondingly increases a function of sensing medical data on the biological body by the thermoelectric generation module.

* * * * *